(12) United States Patent
Kamijima

(10) Patent No.: US 7,722,226 B2
(45) Date of Patent: May 25, 2010

(54) LIGHT SOURCE DEVICE, LIGHTING DEVICE, MONITORING DEVICE, AND PROJECTOR

(75) Inventor: Shunji Kamijima, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 387 days.

(21) Appl. No.: 12/006,969

(22) Filed: Jan. 8, 2008

(65) Prior Publication Data
US 2008/0170208 A1   Jul. 17, 2008

(30) Foreign Application Priority Data
Jan. 11, 2007   (JP) ............................... 2007-003096

(51) Int. Cl.
*F21V 15/01* (2006.01)
(52) U.S. Cl. .................. 362/362; 362/259; 353/119
(58) Field of Classification Search .............. 362/257, 362/259, 362; 353/119
See application file for complete search history.

(56) References Cited

U.S. PATENT DOCUMENTS 1,924,619 A * 8/1933 Mills .......................... 194/202
7,670,010 B2 * 3/2010 Jayaram et al. ............. 353/119

FOREIGN PATENT DOCUMENTS

JP     2001-267670 A     9/2001

\* cited by examiner

*Primary Examiner*—David V Bruce
(74) *Attorney, Agent, or Firm*—AdvantEdge Law Group, LLC

(57) ABSTRACT

A light source device includes: a light source unit which supplies light; a support unit which supports the light source unit; a covering unit which covers the light source unit; a wiring unit which connects a current supply section for supplying current to the light source unit and the light source unit; and a blade disposed at a position shifted toward the support unit from the wiring unit and penetrating through the covering unit.

13 Claims, 10 Drawing Sheets

LIGHT SOURCE DEVICE, LIGHTING DEVICE, MONITORING DEVICE, AND PROJECTOR

BACKGROUND

1. Technical Field

The present invention relates to a light source device, a lighting device, a monitoring device, and a projector, and more particularly to a technology of a light source device included in a projector.

2. Related Art

Recently, a technology of a laser beam source for supplying laser beam used as a light source device of a projector has been proposed. The light source device using the laser beam source has advantages of high color reproducibility, ability of instantaneous turn-on, and long life compared with a UHP lamp used as a light source device in a projector in related art. However, the laser beam source gives uncomfortable effect to a human body, particularly to human eyes in some cases when the laser beam source emits light with a safety device removed. In case of infrared light, it is difficult to visually recognize the infrared light unlike visible light, and therefore the human body may receive harmful effect without recognizing it. In order to prevent these problems, it is demanded that extraction and bad use of the laser beam source by a person having no knowledge of laser beam source technology or the like is securely avoided. For satisfying this demand, a technology of preventing generation of laser beam from a laser resonator (laser beam source unit) having been removed for replacement or for other reasons (for example, see JP-A-2001-267670).

A safety device such as an interlock mechanism is provided on the laser beam device in the related art only for the purpose of preventing problems caused by carelessness during use. Thus, the technology in the related art is insufficient for preventing use of the laser beam device for purposes other than the original purpose such as the case of the laser resonator unit intentionally taken out from the laser beam device after disassembly for using the laser beam resonator for other purposes.

SUMMARY

It is an advantage of some aspects of the invention to provide a light source device capable of securely preventing problems caused by diverted use or bad use of a light source unit included in the light source device, and a lighting device, a monitoring device, and a projector including the light source device.

A light source device according to a first aspect of the invention includes: a light source unit which supplies light; a support unit which supports the light source unit; a covering unit which covers the light source unit; a wiring unit which connects a current supply section for supplying current to the light source unit and the light source unit; and a blade disposed at a position shifted toward the support unit from the wiring unit and penetrating through the covering unit.

For taking out the light source unit from the lighting device, the covering unit needs to be removed. Since the blade is disposed at the position shifted toward the support unit from the wiring unit and penetrating through the covering unit, the wiring unit is cut by the blade when the covering unit is removed. Power supply to the light source unit is cut off by the cutting of the wiring unit, and therefore problems caused by diverted use or bad use of the light source unit extracted from the light source device can be securely prevented. Thus, prevention of problems caused by diverted use or bad use of the light source unit can be securely achieved. Moreover, the light source device capable of preventing diverted use or bad use of the light source unit can be constructed by a simple structure.

A light source device according to a second aspect of the invention includes: a light source unit which supplies light; a support unit which supports the light source unit; a wiring unit which connects a current supply section for supplying current to the light source unit and the light source unit; and a blade disposed at a position shifted toward the support unit from the wiring unit. The support unit has a concave for accommodating the blade. The length of the blade in the depth direction of the concave is smaller than the depth of the concave. Since the blade is disposed at the position shifted toward the support unit from the wiring unit, the wiring unit can be cut by raising the blade. Moreover, the blade can be securely accommodated within the concave so as to avoid cutting of the wiring unit except for the case when the blade is raised. Thus, the light source device provided according to the second aspect of the invention can securely prevent problems caused by diverted use or bad use of the light source unit. In addition, the light source device capable of preventing diverted use or bad use of the light source unit can be constructed by a simple structure.

It is preferable that the support unit has a concave for accommodating the blade, and that the length of the blade in the depth direction of the concave is smaller than the depth of the concave. According to this structure, the blade can be securely accommodated within the concave. Thus, cutting of the wiring unit by the blade except for the case when the covering unit is removed can be avoided.

It is preferable to further include a spring unit which gives urging force for raising the blade toward the wiring unit. According to this structure, the blade can be securely raised by removing the covering unit. Thus, the wiring unit can be securely cut by removing the covering unit.

It is preferable that the cross section of the blade at one end is different in size from that at the other end. Since the blade is removable, breakage of the light source device at the time of maintenance or manufacture by a person having technical knowledge of the light source device or the like can be avoided. Moreover, since the shape of the cross section at one end is different from that at the other end, the blade is removable only in one direction. Thus, removal or disassembly of the blade by a person having no technical knowledge of the light source device or the like can be prevented. Accordingly, both prevention of problems and removal of the covering unit at the time of maintenance or manufacture can be achieved, and therefore easiness of maintenance can be increased.

It is preferable to further include a covering unit which covers the light source unit. In this case, the blade preferably has a screw structure provided at a portion engaging with the covering unit. Since the blade has the screw structure, only a person who has a driver having a special shape or the like can remove the blade. According to this structure, removal or disassembly of the blade by a person having no technical knowledge of the light source device or the like can be prevented. Accordingly, both prevention of problems and removal of the covering unit at the time of maintenance or manufacture can be achieved, and therefore easiness of maintenance can be increased.

It is preferable to further include a covering unit which covers the light source unit, and a holding member which holds the blade on the support unit side at the time of removal of the covering unit by being pushed to a position shifted toward the wiring unit from the blade. Since the holding member is provided, the covering unit can be removed while the blade is being held on the support unit side. Accordingly, removal of the covering unit at the time of maintenance or manufacture can be achieved, and therefore easiness of maintenance can be increased.

It is preferable to further include a plate member disposed in such a position as to contact one end of the holding member. In this case, the holding member is pushed by uniform push of the plate member through an opening formed on the covering unit. According to this structure, only a person who has a pin having a special structure or the like can remove the covering unit while the blade is being held on the support unit side. Accordingly, prevention of problems can be further securely achieved.

It is preferable that the support unit has a plug-in portion into which the holding member is plugged when the holding member is pushed to the position shifted toward the wiring unit from the blade. The plug-in portion preferably has a stopper mechanism which maintains the plug-in condition of the holding member. Since the stopper mechanism is provided, the condition where the blade is held on the support unit side can be maintained. Accordingly, breakage of the light source device during removal of the covering unit can be securely prevented, and therefore easiness of maintenance can be increased.

It is preferable that the support unit has an extruding mechanism which extrudes the holding member from a position above the blade. Since the extruding mechanism is provided, the holding member can be returned to the original position. Thus, return of the holding member to the original condition prior to the push can be achieved.

A lighting device according to a third aspect of the invention has the light source device described above and lights a light receiving object using light emitted from the light source device. Since the light source device described above is provided, problems caused by diverted use or bad use of the light source unit can be securely prevented. Accordingly, the lighting device provided according to the third aspect of the invention can securely prevent problems caused by diverted use or bad use of the light source unit.

A monitoring device according to a fourth aspect of the invention includes: the lighting device described above; and an image acquiring unit which acquires an image of a subject lighted by the lighting device. Since the lighting device described above is provided, problems caused by diverted use or bad use of the light source unit can be securely prevented. Accordingly, the monitoring device provided according to the fourth aspect of the invention can securely prevent problems caused by diverted use or bad use of the light source unit.

A projector according to a fifth aspect of the invention includes: the lighting device described above; and a spatial light modulating device which modulates light emitted from the lighting device according to an image signal. Since the lighting device described above is provided, problems caused by diverted use or bad use of the light source unit can be securely prevented. Accordingly, the projector provided according to the fifth aspect of the invention can securely prevent problems caused by diverted use or bad use of the light source unit.

BRIEF DESCRIPTION OF THE DRAWINGS

The invention will be described with reference to the accompanying drawings, wherein like reference numbers are given to like elements.

DESCRIPTION OF EXEMPLARY EMBODIMENTS

Several embodiments according to the invention are hereinafter described in detail with reference to the drawings.

First Embodiment

Figure 1:
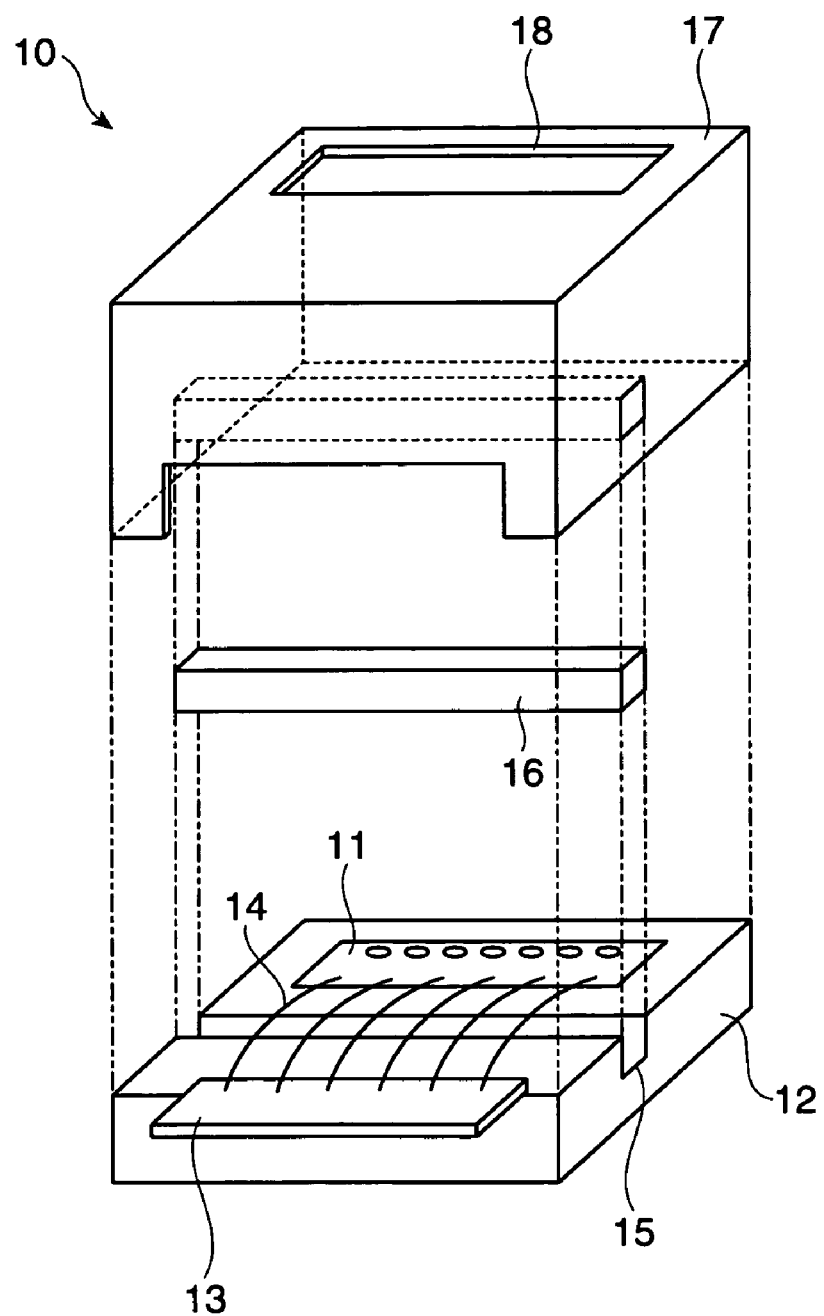
FIG. 1 schematically illustrates a structure of a light source device according to a first embodiment of the invention.

FIG. 1 schematically illustrates a structure of a light source device 10 according to a first embodiment of the invention. A semiconductor laser array 11 is a light source unit for supplying laser beam. A support unit 12 supports the semiconductor laser array 11. A flexible substrate 13 is a current supply unit for supplying current to the semiconductor laser array 11. A plurality of bonding wires 14 are provided between the semiconductor laser array 11 and the flexible substrate 13. The bonding wires 14 are a wiring unit for connecting the flexible substrate 13 and the semiconductor laser array 11.

A concave 15 is formed on the support unit 12 between the semiconductor laser array 11 and the flexible substrate 13. The concave 15 linearly extends through the entire length of the support unit 12 below the bonding wires 14. The concave 15 has a rectangular cross section. A light source cover 17 is formed such that the entire support unit 12 can be engaged therewith. The light source cover 17 is a covering unit for covering a part of the flexible substrate 13, the semiconductor laser array 11, and the bonding wires 14.

A light emission unit 18 is provided on the light source cover 17 at a position corresponding to the position of the semiconductor laser array 11. The light emission unit 18 is an opening formed on the light source cover 17. The light emission unit 18 releases laser beam generated from the semiconductor laser array 11 within the light source cover 17 to the outside of the light source cover 17. The light emission unit 18 may be a covering component made of transparent material. A blade 16 extends through the interior of the light source cover 17 in the left-right direction.

The blade 16 attached to the light source cover 17 is accommodated in the concave 15 while the light source cover 17 is covering the support unit 12. In this condition, the blade 16 is disposed at a position shifted toward the support unit 12 from the bonding wires 14 and linearly extends through the light source cover 17. The light source device 10 may use a light source unit constituted by diode pumped solid state (DPSS) laser, solid laser, liquid laser, gas laser, or the like as well as by semiconductor laser.

Figure 2:
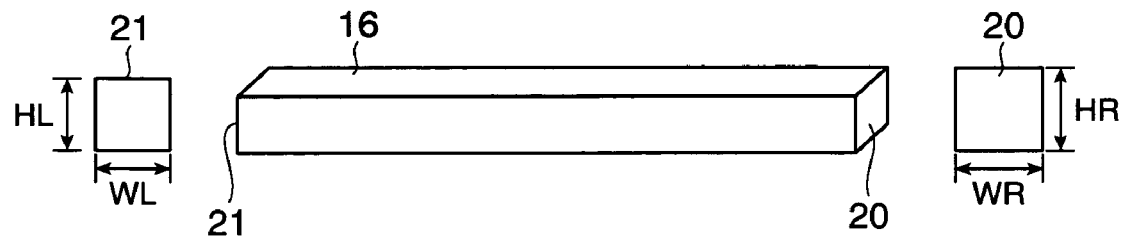
FIG. 2 shows a structure of a blade.

FIG. 2 illustrates the structure of the blade 16. The blade 16 is a bar-shaped component having rectangular cross section structure. Concerning a height HR and a width WR at a right end 20 of the blade 16 and a height HL and a width WL at a left end 21 of the blade 16, the relation HL<HR or WL<WR holds. The blade 16 is so shaped as to have cross sections of the one right end 20 and the other left end 21 different from each other in size.

Figure 3:
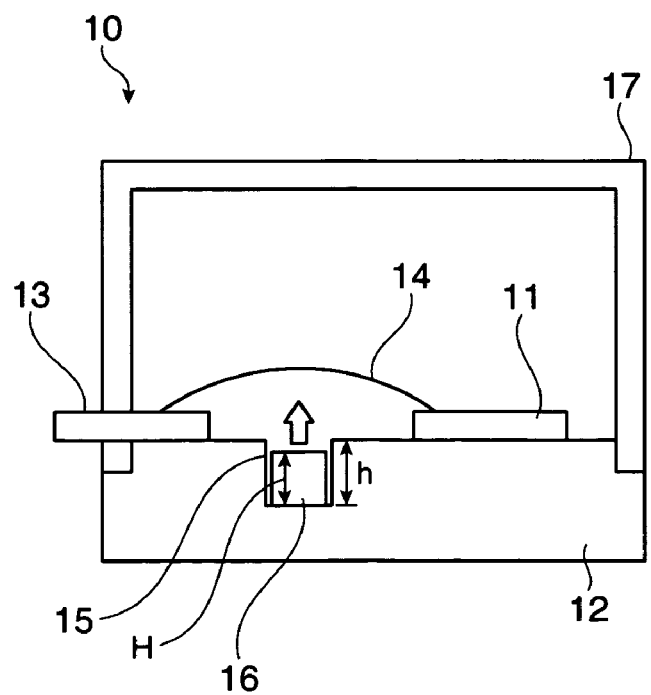
FIG. 3 shows a cross-sectional structure of the light source device.

FIG. 3 illustrates the cross section structure of the light source device 10. When the light source cover 17 is removed from the support unit 12 with the blade 16 attached to the light source cover 17, the blade 16 is raised with the light source cover 17 from the concave 15. By the lift of the blade 16 from the support unit 12, the blade 16 cuts the bonding wires 14 provided on the side opposite to the support unit 12.

Thus, the blade 16 cuts the bonding wires 14 at the time of removal of the light source cover 17. By cutting off power supply to the semiconductor laser array 11 achieved by cutting the bonding wires 14, diverted use and bad use of the semiconductor laser array 11 extracted from the light source device 10 can be securely prevented. Accordingly, problems caused by diverted use or bad use of the light source unit can be securely prevented. Moreover, the device capable of preventing diverted use or bad use of the light source unit can be provided by a simple structure.

A height H of the blade 16 shown in the figure indicates the larger one of the height HR at the right end 20 and the height HL at the left end 21. The height H is the maximum length of the blade 16 in the depth direction of the concave 15. Concerning the height H of the blade 16 and a depth h of the concave 15, the relation H<h holds. In this structure, the blade 16 can be securely accommodated in the concave 15. Thus, cutting the bonding wires 14 by the blade 16 can be avoided except for the case when the light source cover 17 is removed.

The blade 16 can be removed from the support unit 12 and the light source cover 17 while the light source cover 17 is being attached to the support unit 12. After removal of the blade 16, the light source cover 17 can be taken out without cutting the bonding wires 14. Thus, the light source device 10 is not broken at the time of maintenance or manufacture by a person having technical knowledge of the light source device 10, for example.

The blade 16 having the right end 20 larger than the left end 21 can be removed only in the right direction. Since the blade 16 can be removed only in one direction, removal or disassembly by a person having no technical knowledge of the light source device 10 or the like can be prevented. Particularly, the structure having the blade 16 which cannot be easily removed can be produced by slightly changing the size of the right end 20 from the size of the left end 21. This structure prevents problems and allows removal of the light source cover 17 at the time of maintenance or manufacture, thereby increasing easiness of maintenance.

Figure 4:
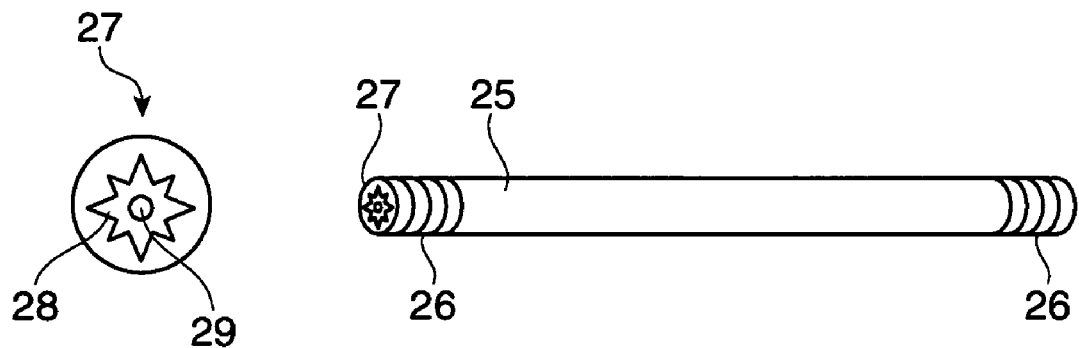
FIG. 4 shows a blade according to a modified example.

FIG. 4 illustrates a blade in a modified example. A blade 25 shown in FIG. 4 has a cylindrical shape having a circular cross section. A screw structure 26 is formed on each end of the blade 25 engaging with the light source cover 17. The blade 25 is fixed to the light source cover 17 by screwing the screw structures 26 into the light source cover 17.

A groove 28 is formed at an end surface 27 of the blade 25. The groove 28 has a special shape unlike plus shape or minus shape used for an ordinary screw, such as a combination of star shapes as illustrated in the figure. A projection 29 is provided at the center of the groove 28. In the condition where the blade 25 is fixed to the light source cover 17, the blade 25 can be removed only by using a particular driver which fits with the special groove 28 and the projection 29.

Thus, only a person who has a driver having a particular shape can remove the blade 25, and removal of the blade 25 or disassembly of the light source device 10 by a person having no technical knowledge of the light source device 10 or the like can be prevented. In this case, removal of the light source cover 17 at the time of maintenance or manufacture and prevention of problems can be both achieved, and therefore easiness of maintenance can be increased similarly to the above example. The structure of the blade is not limited to those shown in this embodiment, but may be any structures as long as they can prevent removal of the light source device 10 by a person having no technical knowledge of the light source device 10 or the like.

Second Embodiment

Figure 5:
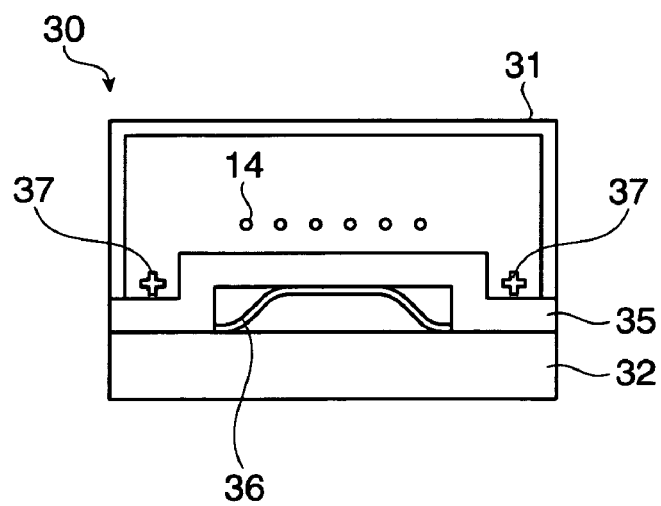
FIG. 5 illustrates a cross-sectional structure of a main part of a light source device according to a second embodiment of the invention.

FIG. 5 illustrates a cross-sectional structure of a main part included in a light source device 30 according to a second embodiment of the invention. The light source device 30 is characterized by having a spring 36 and holding members 37. Similar reference numbers are given to the components similar to those in the first embodiment, and the same explanation of those is not repeated. The cross section shown in FIG. 5 is a cross section taken along a blade 35 and orthogonal to the bonding wires 14. The spring 36 is a plate spring which gives urging force for pushing up the blade 35 toward the bonding wires 14. The blade 35 has a deformed portion at a position corresponding to the position of the bonding wires 14 so as to form a space for accommodating the spring 36 between the blade 35 and a support unit 32.

Figure 6:
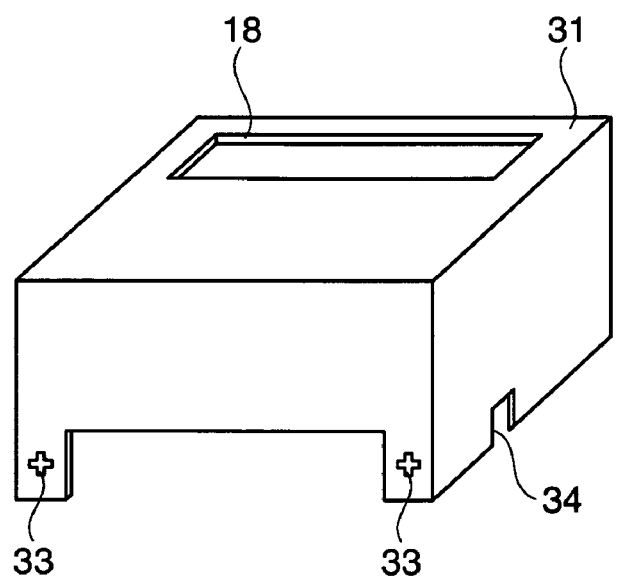
FIG. 6 is a perspective view showing a structure of a light source cover.

FIG. 6 is a perspective view illustrating a structure of a light source cover 31. A concave 34 is formed on each of the left and right sides of a light source cover 31. The concave 34 has a rectangular shape substantially the same as the cross-sectional shape of the blade 35. The concave 34 pushes both ends of the blade 35 against the support unit 32 while the light source cover 31 is being attached to the support member 32 (see FIG. 5). When the light source cover 31 is removed from the support unit 32, the concave 34 releases pushing given to the blade 35. As a result, the blade 35 is raised toward the bonding wires 14 by the urging force of the spring 36. Thus, the bonding wires 14 can be securely cut at the time of removal of the light source cover 31 by using the urging force of the spring 36.

Returning to FIG. 5, the holding members 37 are provided at two positions above the blade 35 and close to the light source cover 31. Each of the holding members 37 has a cross-shaped cross section, and is a cylindrical component whose longitudinal direction corresponds to the direction orthogonal to the sheet surface of the figure. As illustrated in FIG. 6, the light source cover 31 has pin insertion holes 33 at positions corresponding to the positions of the holding members 37. Each of the pin insertion holes 33 is an opening formed on the light source cover 31 and has a cross shape substantially the same as the cross section of the holding member 37.

Figure 7:
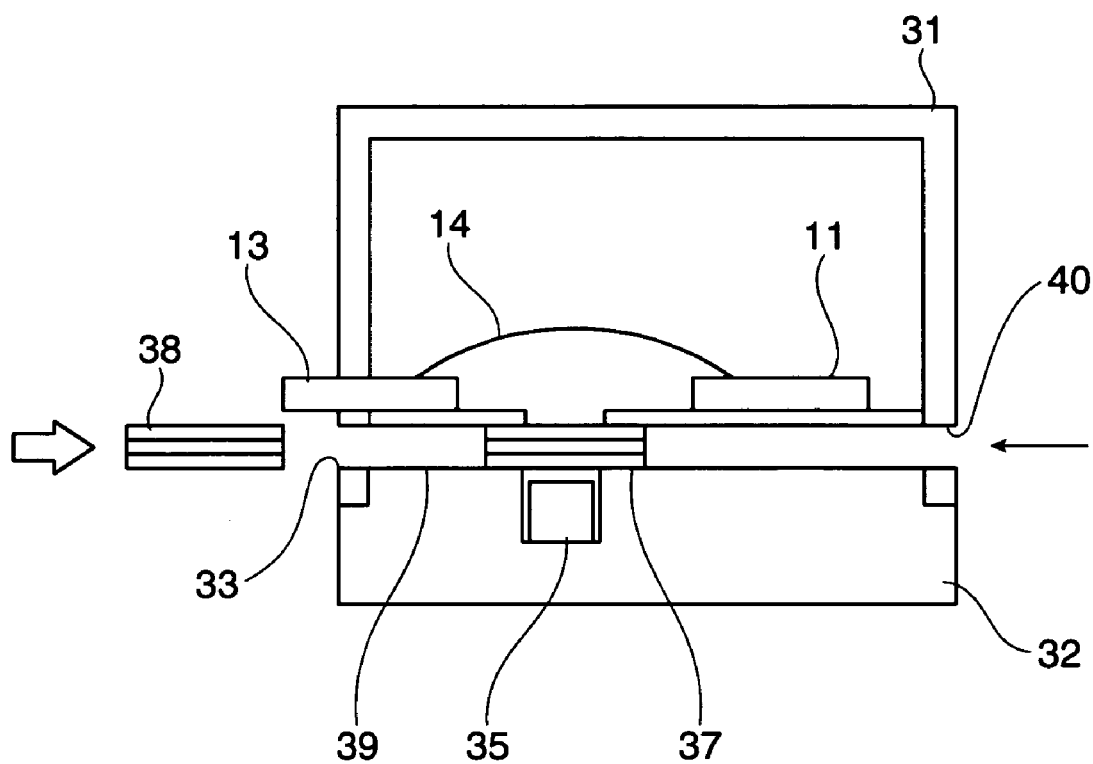
FIG. 7 shows a cross-sectional structure of a part where a holding member is provided.

FIG. 7 illustrates a cross-sectional structure of the part having the holding members 37 in the structure shown in FIG. 5. Each of the holding members 37 is disposed within a through hole 39. The through hole 39 formed on the support unit 32 above the blade 35 extends therethrough in the direction orthogonal to the blade 35. The holding member 37 is pushed into a position between the blade 35 and the bonding wires 14 by a pin 38 inserted through the pin insertion hole 33.

The holding member 37 pushed into the position shifted toward the bonding wires 14 from the blade 35 holds the blade 35 at a position on the support unit 32 side at the time of removal of the light source cover 31. An air supply hole 40 is formed on the light source cover 31 at a position corresponding to the through hole 39 on the side opposite to the pin insertion hole 33. After attachment of the light source cover 31, air is supplied through the air supply hole 40 to shift the holding member 37 from the position above the blade 35 toward the position of the pin insertion hole 33. The air supply hole 40 and the through hole 39 constitute an extruding mechanism for extruding the holding member 37 from the position above the blade 35 toward the position of the pin insertion hole 33. This mechanism returns the holding member 37 to the original condition before the holding member 37 is pushed.

For pushing the holding member 37 from the position near the pin insertion hole 33 to the position above the blade 35 through the through hole 39, the pin 38 having a shape allowing insertion into the pin insertion hole 33 is needed. Thus, only a person having the pin 38 can push the blade 35, and pushing of the blade 35 and disassembly of the light source device 30 by a person having no technical knowledge of the light source device 30 or the like can be prevented. In this case, removal of the light source cover 31 at the time of maintenance or manufacture and prevention of problems can be both achieved, and therefore easiness of maintenance can be increased similarly to the above examples.

The cross-sectional shapes of the pin insertion hole 33 and the holding member 37 are not limited to those in this embodiment, but may be other shapes as long as the holding member 37 can be easily pushed by using an object other than the pin 38 having a shape allowing insertion into the pin insertion hole 33. In this case, a more complicated shape is preferable for reducing possibilities of diverted use or bad use of the semiconductor laser array 11. The structure of the holding member 37 is not limited to the mechanism which shifts the holding member 37 toward the pin insertion hole 33 by the airflow supplied through the air supply hole 40. For example, the holding member 37 may be extruded toward the pin insertion hole 33 by insertion of a pin from the air supply hole 40 side.

Figure 8:
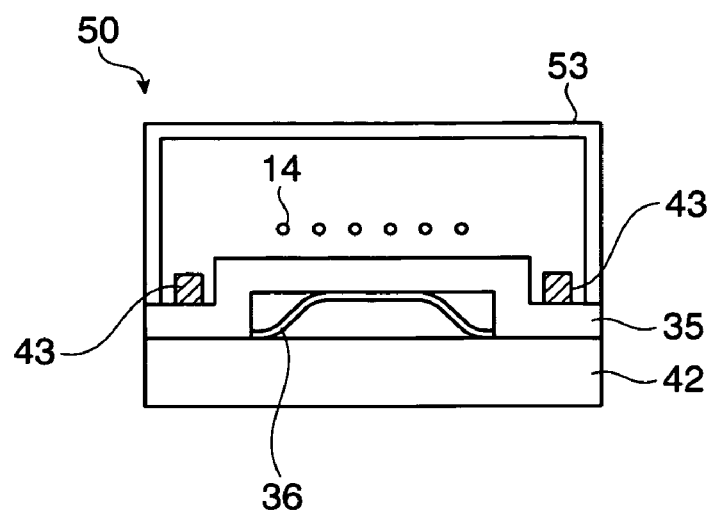
FIG. 8 illustrates a cross-sectional structure of a main part of a light source device according to a modified example of the second embodiment.
Figure 9:
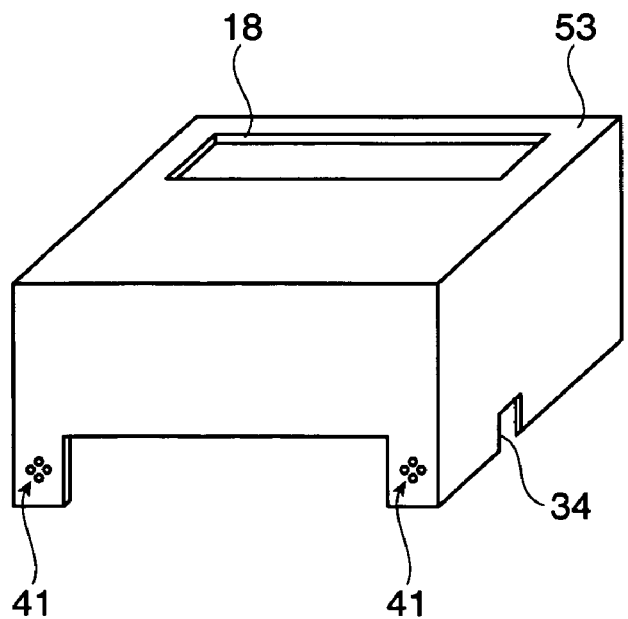
FIG. 9 is a perspective view showing a structure of a light source cover.

FIG. 8 illustrates a cross-sectional structure of a main part included in a light source device 50 in a modified example of this embodiment. The light source device 50 according to this modified example has a holding member 43 having a shape different from that of the light source device 30 in the above example. As can be seen from the cross-sectional view, the holding member 43 has a rectangular shape. As illustrated in the perspective view of the structure shown in FIG. 9, a pin insertion hole 41 is formed on a light source cover 53 at a position corresponding to each of the holding members 43. Each of the pin insertion holes 41 is an opening formed on the light source cover 53, and has four circular shapes at positions corresponding to vertexes of a square.

Figure 10A:
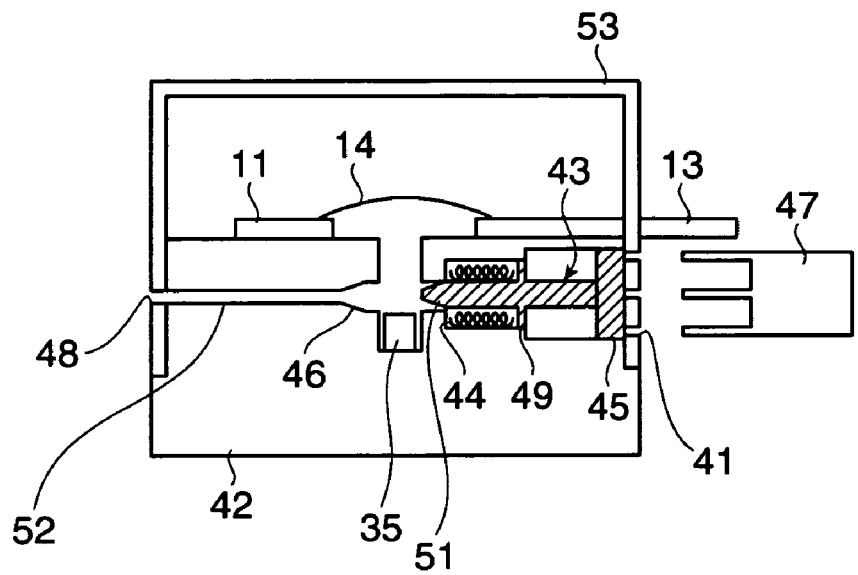
FIG. 10A shows a cross-sectional structure of a part where a holding member is provided.
Figure 10B:
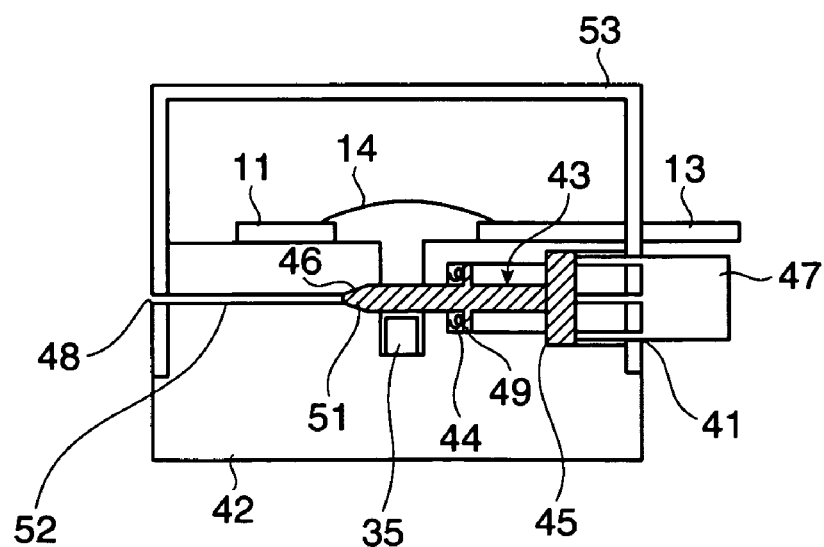
FIG. 10B shows a cross-sectional structure of the part where the holding member is provided.

Each of FIGS. 10A and 10B illustrates a cross-sectional structure of a part having the holding member 43 in the structure shown in FIG. 8. FIG. 10A shows the condition where the holding member 43 is disposed at a position shifted toward the pin insertion hole 41 from a position above the blade 35. A plate member 45 as a plate-shaped component is provided between the holding member 43 and the pin insertion hole 41. The plate member 45 contacts one end of the holding member 43 on the pin insertion hole 41 side. The plate member 45 and the holding member 43 may be provided as one body.

The holding member 43 has a vane 49 provided in the vicinity of the center of a bar-shaped member having a rectangular cross section. The vane 49 has a thin plate shape and is disposed orthogonal to the longitudinal direction of the bar-shaped member. A distal end 51 of the holding member 43 on the side opposite to the plate member 45 has a tapered shape gradually tapered toward the end. A support unit 42 has a space around the holding member 43. A part of the space ranging from the plate member 45 to the vane 49 has a width sufficient for the movement of the plate member 45. A part of the space ranging from the vane 49 to the distal end 51 has a width sufficient for the movement of the vane 49. A part of the space ranging from the distal end 51 to the tip has a width sufficient for receiving the bar-shaped member of the holding member 43. A spring 44 is provided in the part of the space for shifting the vane 49. The spring 44 gives urging force for pushing the vane 49 toward the pin insertion hole 41.

A plug-in portion 46 is formed on a support unit 42 on the side opposite to the holding member 43 as viewed from the blade 35. The plug-in portion 46 has a shape slightly smaller than the shape of the distal end 51. A through hole 52 extends from the plug-in portion 46 to an air supply hole 48.

FIG. 10B shows a condition where the holding member 43 is pushed from the position shown in FIG. 10A toward the position above the blade 35. For pushing the holding member 43 at the position shown in FIG. 10A to the position above the blade 35, the plate member 45 needs to be uniformly pushed by a pin 47 having a shape allowing insertion into the pin insertion hole 41. The holding member 43 is pushed by the uniform push of the plate member 45 via the pin insertion hole 41.

The holding member 43 pushed by the pin 47 shifts to the position above the blade 35 while contracting the spring 44 via the vane 49. At the time of removal of the light source cover 53, the holding member 43 is pushed to the position shifted toward the bonding wires 14 from the blade 35 to hold the blade 35 on the support unit 42 side. When the holding member 43 is pushed to the position above the blade 35, the distal end 51 is plugged into the plug-in portion 46. The plug-in portion 46 having a shape slightly smaller than that of the distal end 51 fixes the distal end 51 under the condition where the distal end 51 is plugged into the plug-in portion 46. Thus, the holding member 43 remains at the position above the blade 35 after pushing of the plate member 45 by the pin 47 is stopped. Accordingly, the plug-in portion 46 constitutes a stopper mechanism for maintaining the condition of the distal end 51 of the holding member 43 inserted into the plug-in portion 46.

The condition where the blade 35 is retained on the support unit 42 side can be maintained by the stopper mechanism. Thus, breakage of the light source device 50 during removal of the light source cover 53 can be securely avoided, and easiness of maintenance can be further increased. After the light source cover 53 is attached, air is supplied through the air supply hole 48 to shift the supporting member 43 from the position above the blade 35 to the position on the pin insertion hole 41 side. The air hole 48 and the through hole 52 constitute an extruding mechanism for extruding the holding member 43 from the position above the blade 35.

For uniformly pushing the plate member 45, the pin 47 having a shape allowing insertion into the pin insertion hole 41 is needed. The structure according to this modified example prevents problems and allows removal of the light source cover 53 at the time of maintenance or manufacture, thereby increasing easiness of maintenance. The shape of the pin insertion hole 41 is not limited to that shown in this modified example, but may be other shapes as long as an object other than the pin 47 allowing insertion into the pin insertion hole 41 cannot easily push the holding member 43. A more complicated shape is preferable for reducing possibilities of diverted use or bad use of the semiconductor laser array 11.

The plug-in member 46 is not limited to the shape slightly smaller than that of the distal end 51, but may be other shapes as long as the condition of the holding member 43 plugged into the plug-in portion 46 can be retained. For example, the plug-in portion 46 may have a shape capable of engaging with a part of the holding member 43 to obtain the function of the stopper mechanism. The structure of the holding member 43 and the shape of the support unit 42 in the area for shifting the holding member 43 are not limited to those shown in this modified example. Appropriate modifications and changes may be made for those structures as long as the same advantages as those in this modified example can be offered.

Third Embodiment

Figure 11:
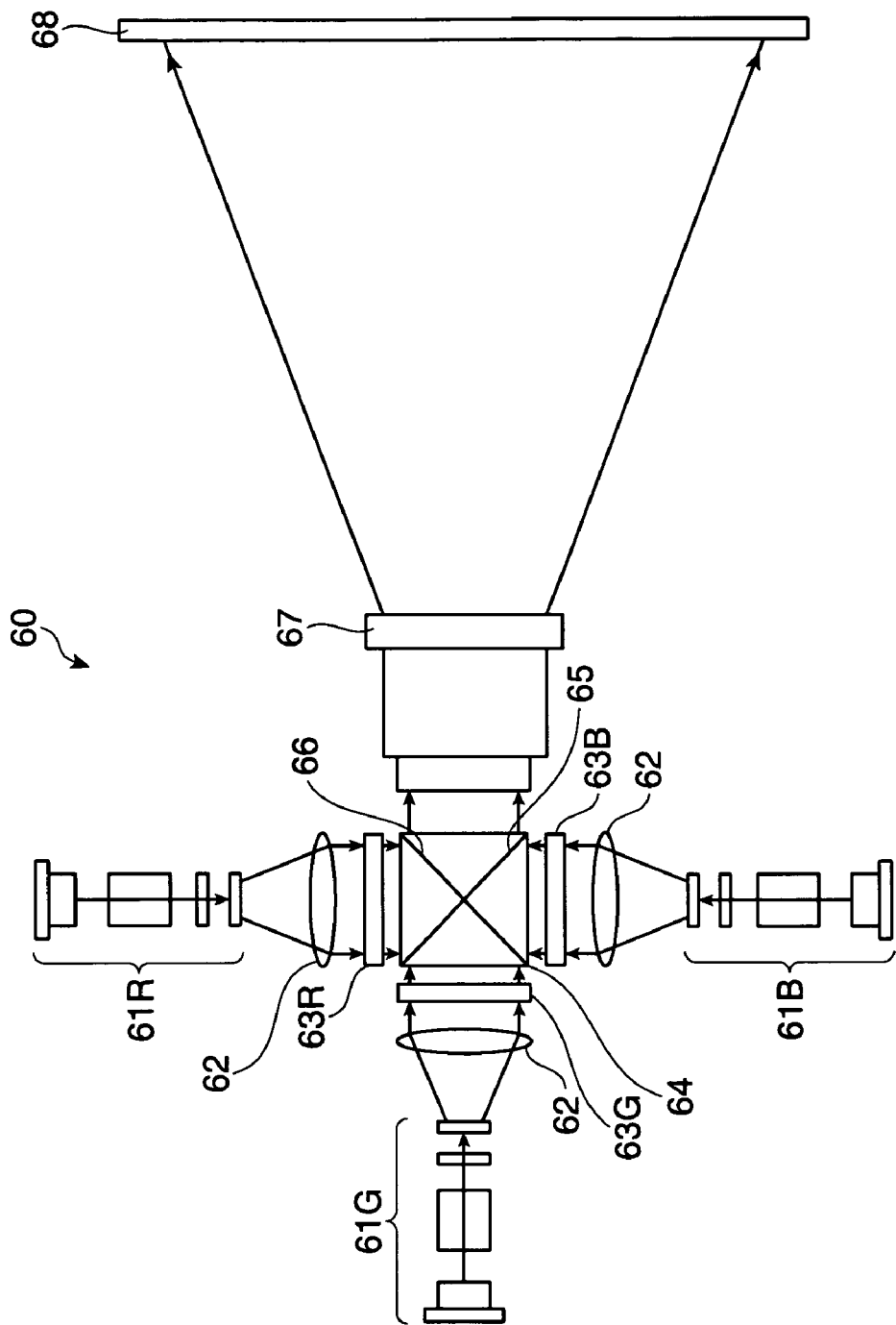
FIG. 11 schematically illustrates a projector according to a third embodiment of the invention.

FIG. 11 schematically illustrates a structure of a projector 60 according to a third embodiment of the invention. The projector 60 is a front-projection-type projector which supplies light to a screen 68 and obtains reflection light reflected by the screen 68 as light to be observed as an image. The same explanation as that in the first embodiment is not repeated. The projector 60 includes a lighting device 61R for red (R) light, a lighting device 61G for green (G) light, and a lighting device 61B for blue (B) light. The projector 60 displays an image by using lights emitted from the respective lighting devices 61R, 61G and 61B.

The R light lighting device 61R is a lighting device which supplies R light. A field lens 62 collimates the R light emitted from the R light lighting device 61R, and supplies the collimated R light to an R light spatial light modulating device 63R as a light receiving object. The R light spatial light modulating device 63R is a spatial light modulating device which modulates the R light from the R light lighting device 61R according to an image signal, and is constituted by a transmission-type liquid crystal display device. The transmission-type liquid crystal display device may be a high temperature polysilicon (HTPS) TFT liquid crystal panel, for example. The R light modulated by the R light spatial light modulating device 63R enters a cross dichroic prism 64 as a color synthesizing optical system.

The G light lighting device 61G is a lighting device which supplies G light. The field lens 62 collimates the G light emitted from the G light lighting device 61G, and supplies the collimated G light to a G light spatial light modulating device 63G. The G light spatial light modulating device 63G is a spatial light modulating device which modulates the G light from the G light lighting device 61G according to an image signal, and is constituted by a transmission-type liquid crystal display device. The G light modulated by the G light spatial light modulating device 63G enters the cross dichroic prism 64 from a side different from the side the R light enters.

The B light lighting device 61B is a lighting device which supplies B light. The field lens 62 collimates the B light emitted from the B light lighting device 61B, and supplies the collimated B light to a B light spatial light modulating device 63B. The B light spatial light modulating device 63B is a spatial light modulating device which modulates the B light from the B light lighting device 61B according to an image signal, and is constituted by a transmission-type liquid crystal display device. The B light modulated by the B light spatial light modulating device 63B enters the cross dichroic prism 64 from a side different from the sides the R and G lights enter.

The cross dichroic prism 64 has a pair of dichroic films 65 and 66 disposed substantially orthogonal to each other. The first dichroic film 65 reflects R light and transmits G and B lights. The second dichroic film 66 reflects B light and transmits R and G lights. The cross dichroic prism 64 synthesizes the R, G and B lights entering in different directions, and releases the light after synthesis toward a projection lens 67. The projection lens 67 projects the light produced by synthesis of the cross dichroic prism 64 toward the screen 68.

Figure 12:
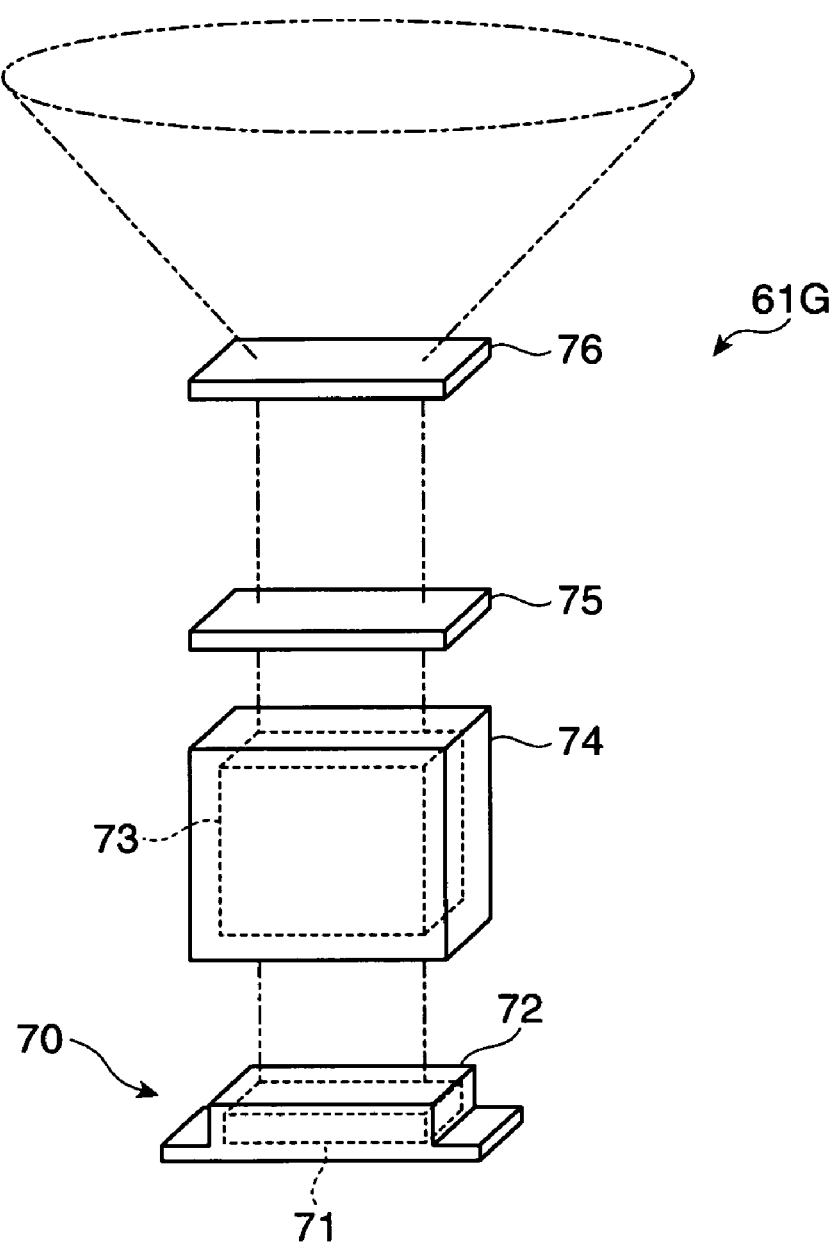
FIG. 12 illustrates a structure of a G light lighting device as a lighting device.

FIG. 12 illustrates the structure of the G light lighting device 61G as a lighting device. The G light lighting device 61G lights the G light spatial light modulating device 63G as a light receiving object (see FIG. 11) by using laser beam supplied from a light source device 70. A semiconductor laser array 71 is covered by a light source cover 72. The semiconductor laser array 71 is a light source unit for supplying laser beam, and supplies laser beam having 1064 nm, for example. The light source device 70 has the same structure as that of the light source device discussed in the first or second embodiment.

An SHG element 73 is contained in a jacket 74. The SHG element 73 is a wavelength converting element which converts the wavelength of the laser beam emitted from the semiconductor laser array 71. The SHG element 73 converts the laser beam emitted from the semiconductor laser array 71 into laser beam having 532 nm which is half of the original wavelength. The SHG element 73 may be constituted by a nonlinear optical crystal such as periodically poled lithium niobate ($LiNbO_3$) abbreviated as PPLN.

The laser beam converted into laser beam having the desired wavelength by the SHG element 73 passes a resonant mirror 75, and travels toward a diffusing element 76. Laser beam having wavelengths other than the desired wavelength is reflected by the resonant mirror 75. The laser beam converted into laser beam having the desired wavelength in the area between the semiconductor laser array 71 and the resonant mirror 75 passes the resonant mirror 75 and travels toward the diffusing element 76. This structure allows efficient release of the laser beam having the desired wavelength.

The jacket 74 may be constituted by a material having high heat conductivity such as copper. The jacket 74 contains a temperature control unit and a temperature measuring unit (both not shown). The temperature control unit keeps the temperature of the SHG element 73 substantially constant. The temperature control unit may be constituted by a heater or a Peltier element, for example. Heat can be uniformly supplied to the entire SHG element 73 by using the temperature control unit equipped within the jacket 74. The temperature measuring unit measures the temperature of the SHG element 73. The temperature of the SHG element 73 can be controlled with high accuracy by feedback control over the temperature control unit based on the measurement result obtained by the temperature measuring unit. Since the temperature of the SHG element 73 is kept substantially constant, high wavelength conversion efficiency can be maintained. Accordingly, supply of laser beam can be achieved with high efficiency.

The diffusing element 76 shapes and enlarges the lighting range, and equalizes light quantity distribution of laser beam. The diffusing element 76 may be constituted by a computer generated hologram (CGH) as a diffraction optical element, for example. The R light lighting device 61R and the B light lighting device 61B can be constructed to have the same structure as that of the G light lighting device 61G except that the lighting devices 61R and 61B emit lights different from the light from the lighting device 61G.

Problems caused by diverted use or bad use of the light source unit can be securely prevented by using the light source device 70 which is similar to the light source device used in the first or second embodiment described above. The projector 60 is not limited to a projector which uses transmission-type liquid crystal display devices as spatial light modulating devices, but may use reflection type liquid crystal display devices (liquid crystals on silicon (LCOS), DMDs (digital micromirror devices), GLV (grating light valves) or the like. The projector 60 is not limited to a projector having spatial light modulating devices for the respective lights, but may modulate two, three or a larger number of color lights by one spatial light modulating device. The projector may be a so-called rear projector which supplies light to one surface of the screen and obtains light released from the other surface of the screen as light to be observed as an image.

Fourth Embodiment

Figure 13:
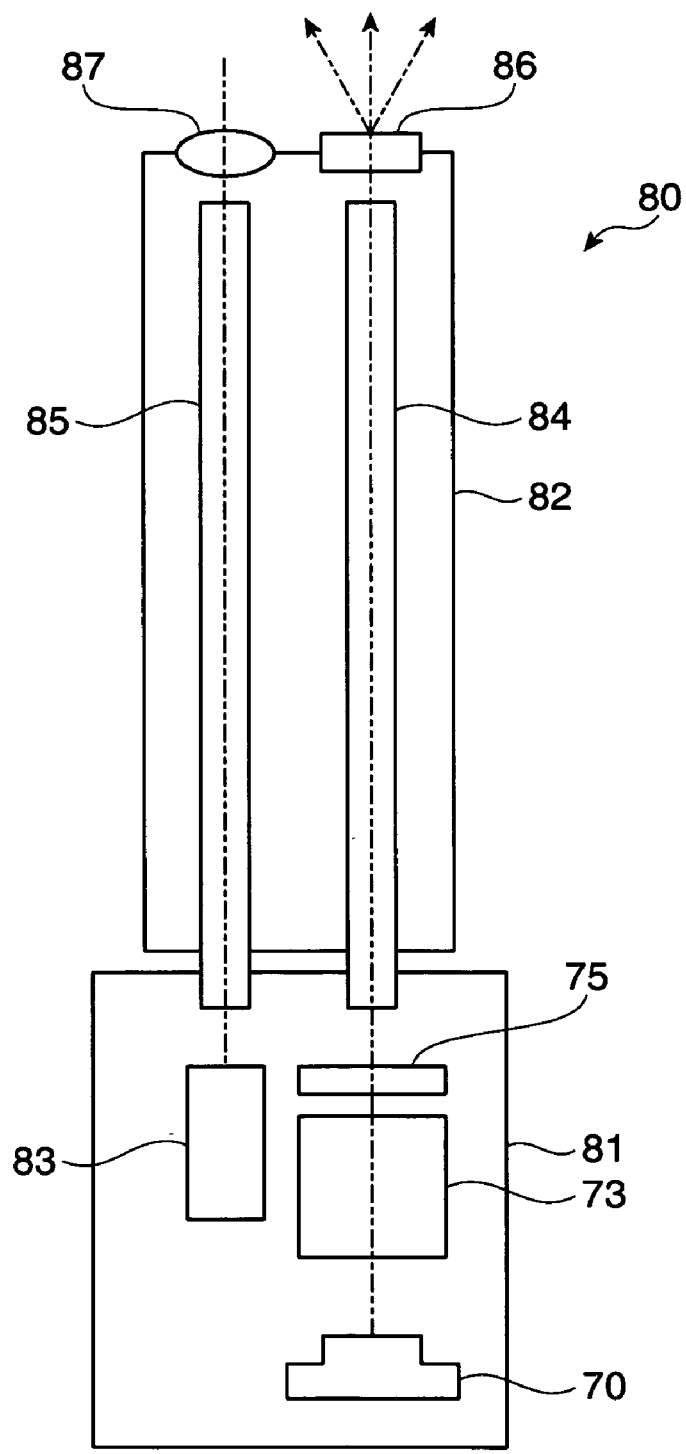
FIG. 13 schematically illustrates a monitoring device according to a fourth embodiment of the invention.

FIG. 13 schematically illustrates a monitoring device 80 according to a fourth embodiment of the invention. The monitoring device 80 includes a device main body 81 and a light guide unit 82. The device main body 81 has the light source device 70 similarly to the projector 60 in the third embodiment. The same reference numbers are given to the same parts as those in the third embodiment, and the same explanation is not repeated.

The light guide unit 82 has two light guides 84 and 85. A diffusing plate 86 and an image formation lens 87 are provided at the end of the light guide unit 82 on a subject (not shown) side. The first light guide 84 guides light emitted from the light source device 70 toward the subject. The diffusing plate 86 is provided on the light emission side of the first light guide 84. The light having propagated within the first light guide 84 passes through the diffusing plate 86 to be diffused on the subject side. The respective components along the optical path from the light source device 70 to the diffusing plate 86 constitute a lighting device for lighting the subject.

The second light guide 85 guides light coming from the subject toward a camera 83. The image formation lens 87 is provided on the light entrance side of the second light guide 85. The image formation lens 87 converges the light coming from the subject on the light entrance surface of the second light guide 85. After entering the second light guide 85 via the image formation lens 87, the light from the subject propagates within the second light guide 85 and enters the camera 83.

The first light guide 84 and the second light guide 85 can be formed by combining a number of optical fibers. Laser beam can be supplied to a distant place by using the optical fibers. The camera 83 is equipped within the device main body 81. The camera 83 is an image acquiring unit which acquires an image of the subject lighted by the respective components disposed along the optical path from the light source device 70 to the diffusing plate 86. The camera 83 acquires the image of the subject by using the light entering through the second light guide 85 into the camera 83.

Problems caused by diverted use or bad use of the light source unit can be securely prevented by using the light source device 70 similar to the light source device used in the first or second embodiment described above. The light source device according to the invention is applicable not only to a projector or a monitoring device, but also to an exposing device which uses laser beam, for example. In addition, the light source device according to each of the embodiments of the invention is not limited to the structure using the laser beam source as the light source unit, but may be a structure which employs a lamp such as a solid light source like LED and an extra-high pressure mercury lamp for the light source unit.

Accordingly, the light source device according to each of the embodiments of the invention is appropriately used for a lighting device included in a projector or a monitoring device.

The entire disclosure of Japanese Patent Application No. 20070003096, filed Jan. 11, 2007 is expressly incorporated by reference herein.

What is claimed is:

1. A light source device, comprising:
   a light source unit which supplies light;
   a support unit which supports the light source unit;
   a covering unit which covers the light source unit;
   a wiring unit which connects a current supply section for supplying current to the light source unit and the light source unit; and
   a blade disposed at a position shifted toward the support unit from the wiring unit and penetrating through the covering unit.

2. A light source device, comprising:
   a light source unit which supplies light;
   a support unit which supports the light source unit;
   a wiring unit which connects a current supply section for supplying current to the light source unit and the light source unit; and
   a blade disposed at a position shifted toward the support unit from the wiring unit,
   wherein
       the support unit has a concave for accommodating the blade, and
       the length of the blade in the depth direction of the concave is smaller than the depth of the concave.

3. The light source device according to claim 1, wherein:
   the support unit has a concave for accommodating the blade; and
   the length of the blade in the depth direction of the concave is smaller than the depth of the concave.

4. The light source device according to claim 1, further comprising a spring unit which gives urging force for raising the blade toward the wiring unit.

5. The light source device according to claim 1, wherein the cross section of the blade at one end is different in size from that at the other end.

6. The light source device according to claim 1, further comprising:
   a covering unit which covers the light source unit,
   wherein the blade has a screw structure provided at a portion engaging with the covering unit.

7. The light source device according to claim 1, further comprising:
   a covering unit which covers the light source unit; and
   a holding member which holds the blade at a position on the support unit side at the time of removal of the covering unit by being pushed to a position shifted toward the wiring unit from the blade.

8. The light source device according to claim 7, further comprising:
   a plate member disposed in such a position as to contact one end of the holding member,
   wherein the holding member is pushed by uniform push of the plate member through an opening formed on the covering unit.

9. The light source device according to claim 7, wherein:
the support unit has a plug-in portion into which the holding member is plugged when the holding member is pushed to the position shifted toward the wiring unit from the blade; and
the plug-in portion has a stopper mechanism which maintains the plug-in condition of the holding member.

10. The light source device according to claim 7, wherein the support unit has an extruding mechanism which extrudes the holding member from a position above the blade.

11. A lighting device which has the light source device according to claim 1 and lights a light receiving object using light emitted from the light source device.

12. A monitoring device, comprising:

the lighting device according to claim 11; and an image acquiring unit which acquires an image of a subject lighted by the lighting device.

13. A projector, comprising:

the lighting device according to claim 11; and a spatial light modulating device which modulates light emitted from the lighting device according to an image signal.

\* \* \* \* \*